(12) United States Patent
Yamaguchi

(10) Patent No.: US 7,884,664 B2
(45) Date of Patent: Feb. 8, 2011

(54) INPUT DEVICE, AND MULTI-FUNCTION PERIPHERAL

(75) Inventor: Ryoji Yamaguchi, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 0 days.

(21) Appl. No.: 12/550,194

(22) Filed: Aug. 28, 2009

(65) Prior Publication Data

US 2010/0052769 A1 Mar. 4, 2010

(30) Foreign Application Priority Data

Aug. 29, 2008 (JP) .............................. 2008-221670

(51) Int. Cl.
*H03K 17/96* (2006.01)
(52) U.S. Cl. ...................................... 327/517
(58) Field of Classification Search .................. 327/509, 327/517
See application file for complete search history.

(56) References Cited

U.S. PATENT DOCUMENTS 4,321,479 A * 3/1982 Ledniczki et al. ........... 307/116

2008/0252608 A1 * 10/2008 Geaghan ..................... 345/173

FOREIGN PATENT DOCUMENTS

| JP | H06-033230 U | 4/1994 |
| JP | H07-084712 A | 3/1995 |
| JP | H11-321021 A | 11/1999 |
| JP | 2001-298514 A | 10/2001 |
| JP | 2003-114736 A | 4/2003 |
| JP | 2008-105333 A | 5/2008 |

* cited by examiner

*Primary Examiner*—Jeffrey S Zweizig
(74) *Attorney, Agent, or Firm*—Baker Botts L.L.P.

(57) ABSTRACT

An input device including an electrode a width dimension of which changes in its direction of extension, an output portion an output signal of which corresponds to an electrostatic capacity induced between the electrode and an electrically charged body when the body approaches or touches the electrode, a detecting portion to detect a change of an output signal value of the output portion, and an operation recognizing portion configured to recognize, on the basis of the detected change of the output signal value, one of a pressing operation and a sliding operation of the body performed with respect to the electrode, wherein the pressing operation is performed by a moving action of the body in which the body approaches or touches the electrode, while the sliding operation is performed by a sliding action of the body in the direction of extension of the electrode while the body is held in close proximity to or in touch with the electrode.

13 Claims, 9 Drawing Sheets

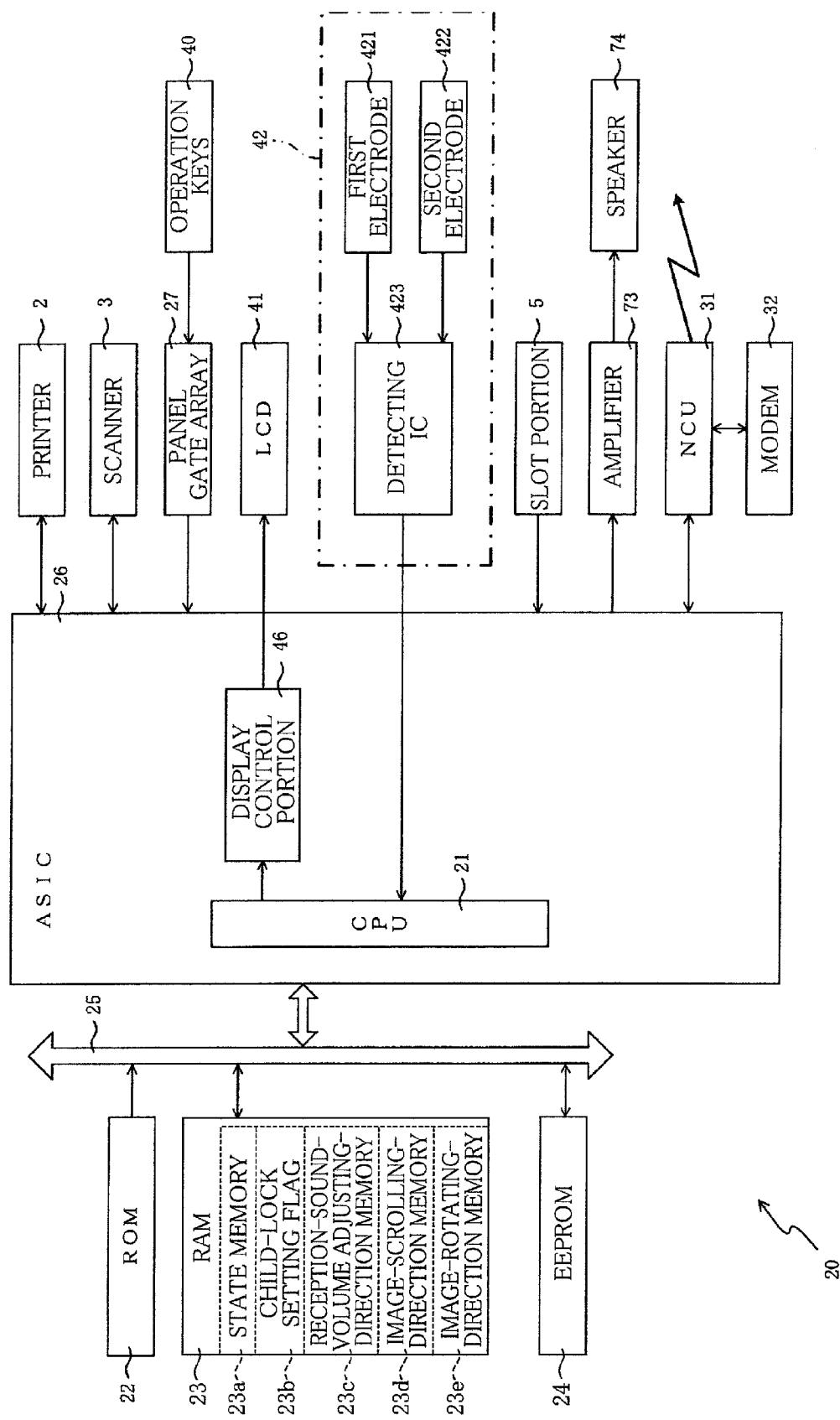

INPUT DEVICE, AND MULTI-FUNCTION PERIPHERAL

CROSS REFERENCE TO RELATED APPLICATION

The present application claims the priority from Japanese Patent Application No. 2008-221670 filed Aug. 29, 2008, the disclosure of which is herein incorporated by reference in its entirety.

BACKGROUND OF THE INVENTION

1. Field of the Invention

The present invention relates to an input device, and a multi-function peripheral provided with the input device.

2. Description of Related Art

There is known an input device including mechanical switches such as pushbuttons and sliding keys, and a CPU (central processing unit) which is connected to the pushbuttons and sliding keys and configured to detect pressing operations of the pushbuttons and sliding operations of the sliding keys.

JP-2008-105333 A discloses (in paragraph [0045] and FIGS. 1 and 2, in particular) a printer 1 including such an input device provided with a power-on pushbutton 12 disposed on a main body housing, and a control portion 41 configured to detect a pressing operation of the power-on pushbutton 12 for power application to the printer 1.

The mechanical switches described above tend to be defective due to contamination with dust and dirt deposited on and around them. In view of this drawback, there has been proposed an input device provided with an electrostatic sensor.

The electrostatic sensor includes electrodes, and a detecting IC (integrated circuit) which is connected to the electrodes to detect a change of an electrostatic capacity induced between each finger-operated electrode and a finger of the operator which has approached or touched the electrode. The electrostatic sensor generates an electric signal corresponding to the change of the electrostatic capacity, so that the CPU can recognize or determine that the finger has approached or touched the electrode.

In the input device provided with the electrostatic sensor described above, however, a sliding action of the operator's finger in one of opposite directions along which a plurality of electrodes are arranged is detected by the detecting IC which is connected to the electrodes and which detects a change of the electrostatic capacity inducted between each electrode and the finger. Namely, the plurality of electrodes and the detecting IC must be connected to each other, leading to a problem of complicated arrangement of the electrostatic sensors.

SUMMARY OF THE INVENTION

The present invention was made in an effort to solve the problems described above. It is therefore a first object of the present invention to provide an input device which has a simple arrangement and which permits easy recognition or determination of a pressing operation and a sliding operation. A second object is to provide a multi-function peripheral provided with such an input device.

The first object indicated above can be achieved according to a first aspect of the present invention, which provides an input device comprising: an electrode extending in a predetermined direction and having a width dimension as seen in a direction intersecting the predetermined direction of extension, the width dimension changing in the predetermined direction of extension; an output portion configured to generate an output signal an output value of which corresponds to an electrostatic capacity induced between the electrode and an electrically charged body when the electrically charged body approaches or touches the electrode; a detecting portion configured to detect a change of the output value of the output signal of the output portion; and an operation recognizing portion configured to recognize, on the basis of the change of the output value detected by the detecting portion, one of a short pressing operation and a sliding operation of the electrically charged body performed with respect to the electrode, the short pressing operation being performed by an action of the electrically charged body in which the electrically charged body approaches or touches the electrode, while the sliding operation being performed by a sliding action of the electrically charged body in the predetermined direction of extension of the electrode while the electrically charged body is held in close proximity to or in touch with the electrode.

In the input device constructed according to the first aspect of this invention, the electrode is shaped to have the width dimension which changes in its direction of extension, so that the output signal of the output portion changes in a pattern corresponding to the change of the width dimension of the electrode, when the sliding operation of the electrically charged body in the form of a finger of an operator of the input device, for example, is performed with respect to the electrode. The pattern of change of the output value of the output signal generated when the sliding operation is performed is different from a pattern of change of the output value of the output signal generated when the short pressing operation is performed with respect to the electrode. Accordingly, the operation recognizing portion can recognize either the short pressing operation or the sliding operation, on the basis of the pattern of change of the output value of the output signal of the output portion. Thus, the short pressing operation or the sliding operation of the electrically charged body can be recognized with a simple arrangement by using the single electrode according to the present invention, rather than a plurality of electrodes used in the prior art.

The second object can be achieved according to a second aspect of this invention, which provides a multi-function peripheral provided with an input device according to the first aspect of this invention described above and having at least two functions selected from among a telephone function, a facsimile function, a printing function, a copying function and a scanning function, the multi-function peripheral comprising: a main body housing of box construction; an image display portion configured to display an image, or at least one operation control portion, which image display portion or at least one operation control portion being disposed on one surface of the main body housing; and an electrode surface on which the electrode of the input device is disposed, and wherein the electrode surface is formed at a corner portion of the main body housing, which corner portion includes a corresponding corner edge of the above-indicated one surface of the main body housing.

In the multi-function peripheral according to the second aspect of this invention, the electrode surface is formed at the corner portion of the main body housing which includes the corresponding corner edge of the surface of the main body housing on which the image display portion or at least one operation control portion is disposed. Accordingly, the pressing and sliding operations of the electrically charged body can be easily performed with respect to the electrode disposed on the electrode surface.

BRIEF DESCRIPTION OF THE DRAWINGS

The above and other objects, features, advantages and technical and industrial significance of the present invention will be better understood by reading the following detailed description of preferred embodiments of the present invention, when considered in connection with the accompanying drawings, in which:

FIG. 2 is a block diagram schematically showing an arrangement of a control portion of the multi-function peripheral;

DETAILED DESCRIPTION OF THE PREFERRED EMBODIMENTS

Figure 1:
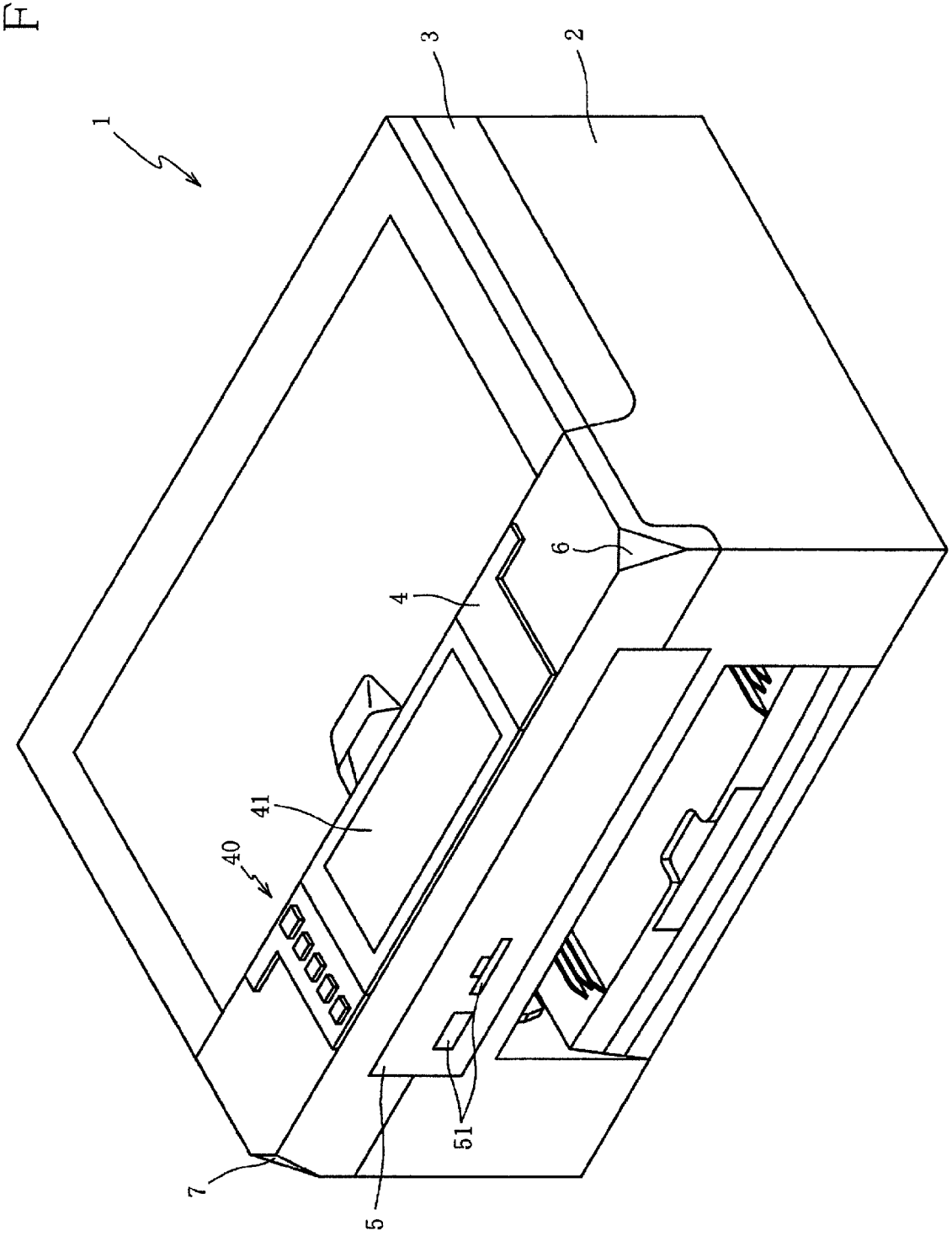
FIG. 1 is a perspective view of a multi-function peripheral constructed according to a first embodiment of this invention.

Preferred embodiments of the present invention will be described by reference to the drawings. The perspective view of FIG. 1 shows an arrangement of a multi-function peripheral 1 (hereinafter abbreviated as "MFP 1") constructed according to the first embodiment of this invention.

The MFP 1 has a plurality of functions including a telephone function, a facsimile (telecopier) function, a printing function and a copying function. In particular, this MFP 1 is characterized by an input device which has a simple arrangement and which permits easy recognition or determination of a pressing operation and a sliding operation.

The MFP 1 has a generally box construction, incorporating a printer 2 in its lower part, a scanner 3 in its upper part, an operation panel 4 in front of the scanner 3, and a slot portion 5 disposed below the operation panel 4 and in the front surface of a main body housing of box construction of the MFP 1. The printer 2 is configured to print images on a recording medium such as sheets of paper, while the scanner 3 is configured to read an original that carries a desired image or images.

The operation panel 4 has operation control portions in the form of various operation keys 40, and an image display portion in the form of a liquid crystal display (hereinafter abbreviated as "LCD") 41. The slot portion 5 has card slots 51 into which various media cards can be directly inserted. The media cards, which may include cards of "compact flash" (registered trademark), and SD memory cards, store image files that are read out to display images on the LCD 41.

The main body housing of the MFP 1 on which the operation panel 4 is disposed has two corner portions respectively having a first-electrode surface 6 on which a first electrode 421 of an electrostatic sensor 42 (shown in FIG. 2) is disposed, and a second-electrode surface 7 on which a second electrode 422 (shown in FIG. 2) of the electrostatic sensor 42 is disposed.

As shown in FIG. 1, each of the first-electrode surface 6 and the second-electrode surface 7 is formed to be substantially similar to an isosceles triangle, by removing corner edges of the upper, front and side surfaces of the main body housing of the MFP 1. The isosceles triangle consists of three sides respectively contiguous with the upper, front and side surfaces of the main body housing.

Referring next to the block diagram of FIG. 2, there is schematically shown an arrangement of a control portion 20 of the MFP 1. The control portion 20 includes an ASIC (Application Specific Integrated Circuit) 26 incorporating a CPU 21. The ASIC 26 is configured to implement a coordinated control operation to control the various functions of the MFP 1, according to commands generated by the CPU 21. To the CPU 21 of the ASIC 26, there is connected the above-indicated electrostatic sensor 42.

The electrostatic sensor 42 includes a first electrode 421, a second electrode 422, and a detecting IC 423, and is configured to generate an output signal to be fed to the CPU 21. The output signal of the electrostatic sensor 42 is generated when a pressing operation or a sliding operation of a finger of the operator of the MFP 1 is performed with respect to the first electrode 421 or second electrode 422. The pressing operation is performed by an action of the finger in which the finger approaches or touches a predetermined region of the first electrode 421 or second electrode 422, while the sliding operation is performed by a sliding action of the finger in a direction of extension of the first electrode 421 or second electrode 422, while the finger is held in close proximity to or in touch with the first electrode 421 or second electrode 422. The output signal has an output value corresponding to an electrostatic capacity induced between the operator's finger and the first electrode 421 or second electrode 422.

Namely, the operator's finger is a body that is slightly electrically charged, so that an approach or touch of the electrically charged finger to or with the first electrode 421 or second electrode 422 causes the finger and the first or second electrode 421, 422 to function as a capacitor, with a result of a flow of an electric current to the first or second electrode 421, 422. The detecting IC 423 converts this electric current into a corresponding voltage value. A digital output signal of the detecting IC 423 which represents the voltage value is fed to the CPU 21.

On the basis of the received output signal of the detecting IC 423, the CPU 21 determines that the pressing operation or sliding operation has been performed with respect to the first or second electrode 421, 422.

Figure 3A:
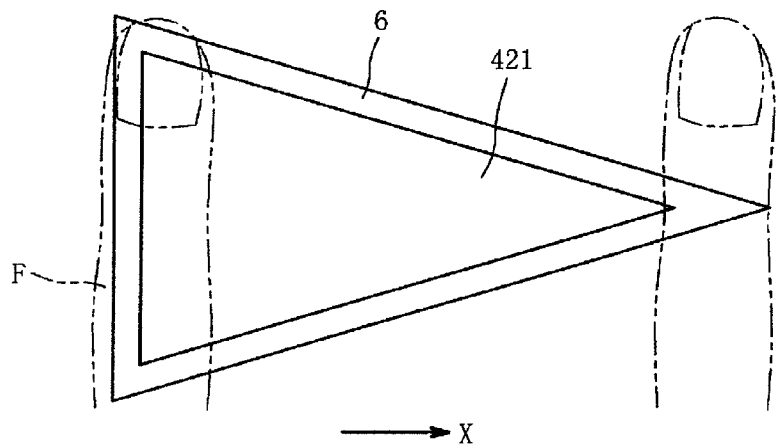
FIG. 3A is a view showing a first electrode disposed on a first-electrode surface, and an operator's finger operating the first electrode.
Figure 3B:
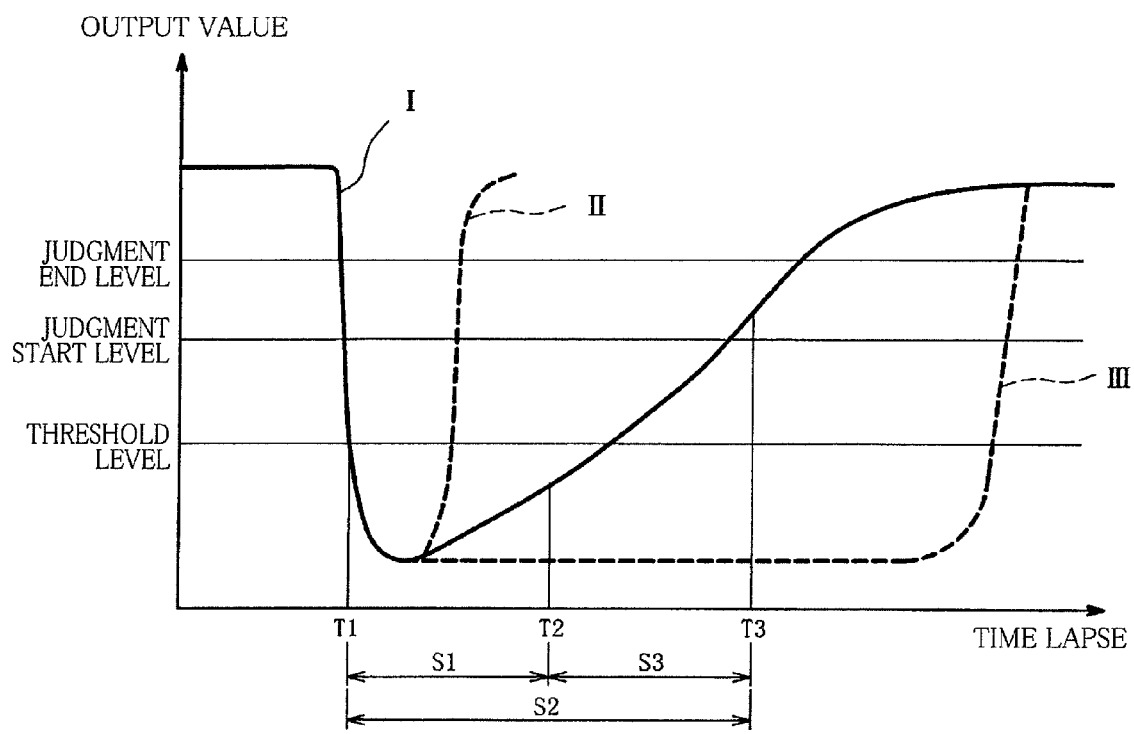
FIG. 3B is a graph indicating a change of an output value of an output signal of a detecting IC, which is generated when the first electrode is operated.

Reference is now made to FIGS. 3A and 3B, to describe a manner of determining the pressing or sliding operation with respect to the first or second electrode 421, 422, on the basis of the output signal of the detecting IC 423 of the electrostatic sensor 42. FIG. 3A is a view showing the first electrode 421 disposed on the first-electrode surface 6, and an operator's finger F operating the first electrode 421, while FIG. 3B is a graph indicating a change of an output value of the output signal of the detecting IC 423, which is generated when the first electrode 421 is operated by the finger F.

As shown in FIG. 3A, the first electrode 421 has a substantially isosceles triangle shape similar to the shape of the first-electrode surface 6 and has a size slightly smaller than that of the first-electrode surface 6. To begin with, a sliding operation of an operator's finger F with respect to the first electrode 421 in a first direction will be described. This sliding operation in the first direction is performed by a sliding action of the finger F in a rightward direction as seen in FIG. 3A (in the direction indicated by an arrow-headed line X), from the left end toward the right end of the first electrode 421, while the finger F is held in close proximity to or in touch with the first electrode 421. In other words, the sliding operation is a moving action of the finger F in the direction from the bottom side of the substantially isosceles triangle of the first electrode 421 toward the apex of the triangle, that is, in the direction in which a dimension of the triangle in a direction parallel to the bottom side substantially linearly and continuously decreases. Namely, a width dimension of the first electrode 421 as seen in a direction perpendicular to the first direction in which the first electrode 421 extends decreases in the rightward direction in which the first electrode 421 extends.

During the sliding operation in the first direction indicated above, the output value of the output signal of the detecting IC 423 changes as indicated by a solid line I indicated in FIG. 3B. In an initial portion of the sliding operation, the output value decreases with an increase of a surface area of the first electrode 421 which is covered by the finger F. Namely, the output value decreases to a predetermined value as the right side surface of the finger F is initially moved in the rightward direction from the left edge (bottom side) of the first electrode 421. As the finger F is subsequently further moved in the rightward direction indicated by the arrow-headed line X in FIG. 3A, the surface area of the first electrode 421 covered by the finger F gradually decreases, so that the output value substantially linearly increases. The output value returns back to the initial value when the finger F has passed the apex of the substantially isosceles triangle of the first electrode 421.

The above-indicated gradual decrease of the surface area of the first electrode 421 covered by the finger F as the finger F is moved in the first direction means a decrease of the surface area of the first electrode 421 which is in touch with or opposed to the finger F moved in the first direction. The above-indicated increase of the output value of the output signal of the detecting IC 423 during the sliding operation in the first direction means a change of the output value which corresponds to the sliding operation.

Then, a sliding operation of the finger F in a second direction opposite to the above-described first direction will be described. This sliding operation in the second direction is a sliding operation in a leftward direction as seen in FIG. 3A (in the direction opposite to the direction indicated by the arrow-headed line X), from the right end toward the left end of the first electrode 421.

In this case, the output value of the output signal of the detecting IC 423 changes in a pattern reversed with respect to that in the case of the sliding operation in the first direction. Namely, the output value decreases to a predetermined value as the left side surface of the finger F is initially moved in the leftward direction from the right edge (apex) of the first electrode 421. A rate of this initial decrease of the output value during the sliding operation in the second direction is lower than the rate of the initial decrease during the sliding operation in the first direction, which rate is indicated by the solid line I in FIG. 3B. As the finger F is subsequently moved in the leftward or second direction (in the direction opposite to the direction indicated by the arrow-headed line X in FIG. 3A), the surface area of the first electrode 421 covered by the finger F gradually increases, so that the output value substantially linearly decreases. The output value returns back to the initial value when the finger F has passed the bottom side of the substantially isosceles triangle of the first electrode 421.

Next, a short pressing operation of the finger F with respect to the first electrode 421 will be described. For example, the finger F first approaches or touches the right end of the first electrode 421, and subsequently moves away from the first electrode 421 in a relatively short time. In this case, the output value initially decreases to the predetermined value, as indicated by the solid line I in FIG. 3A. Then, the output value abruptly increases back to the initial value, as indicated by a broken line II in FIG. 3B. A rate of this increase is higher than the rate of increase back to the initial value indicated by the solid line I.

Where the finger F first approaches or touches the right end of the first electrode 421, and subsequently moves away from the first electrode 421 in a comparatively long time, that is, where a long pressing operation of the finger F is performed, the output value initially decreases to the predetermined value, as indicated by the solid line I, but the output value subsequently remains at that predetermined value for a relatively long time, and then returns back to the initial value, as indicated by a broke line III in FIG. 3B.

Figure 5:
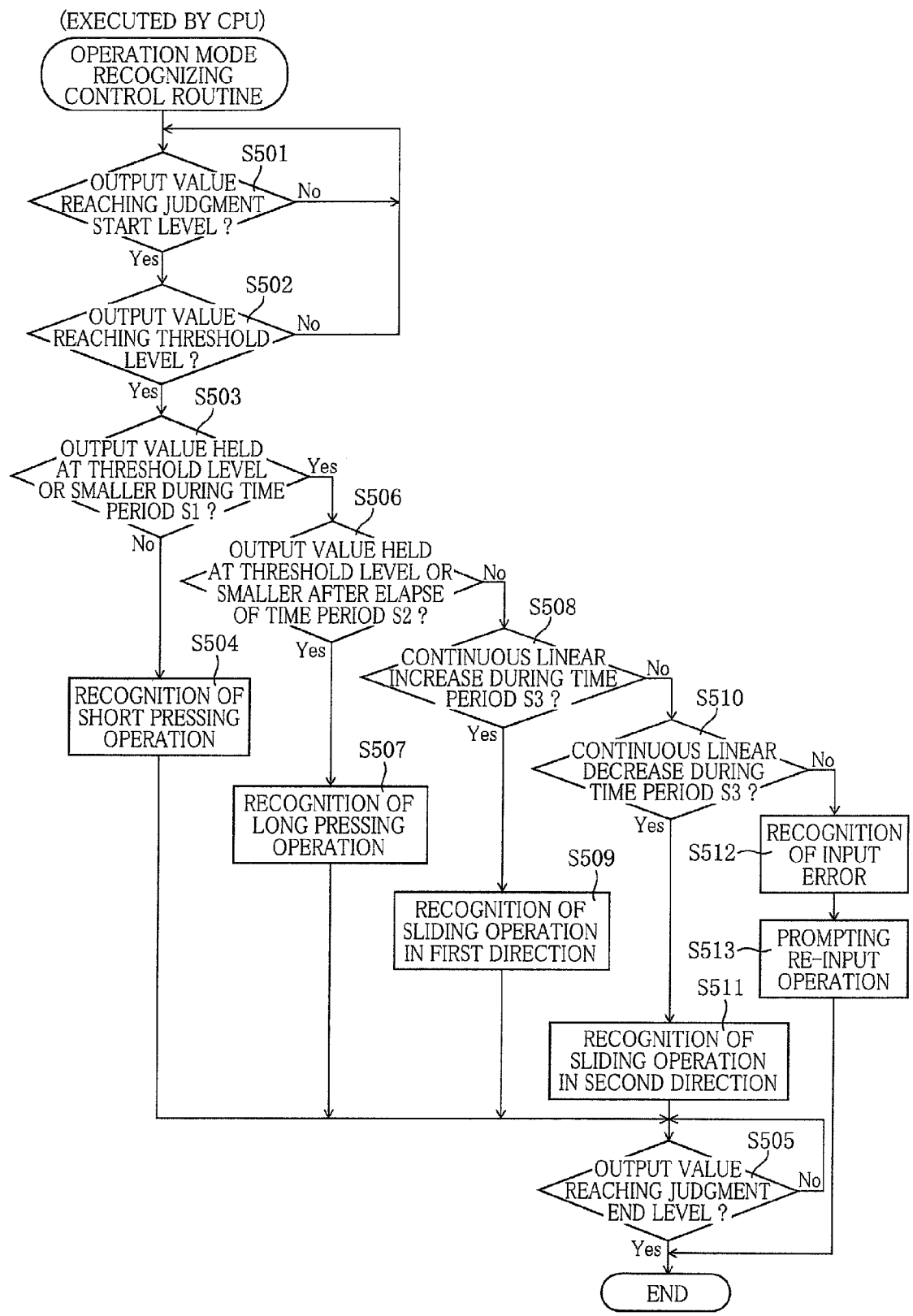
FIG. 5 is a flow chart illustrating an operation mode recognizing control routine executed by the control portion.

In the present embodiment, an operation mode recognizing control routine illustrated in the flow chart of FIG. 5 is executed by the CPU 21 to recognize one of the sliding operation in the first direction, sliding operation in the second direction, short pressing operation and long pressing operation, with respect to the first electrode 421 or second electrode 422, by comparing the pattern of actual change of the output value of the output signal of the detecting IC 423, with the pattern indicated by the solid line I, the pattern reversed with the pattern indicated by the solid line I, and the patterns indicated by the broken lines II and III.

As described above, the present embodiment is configured to permit easy recognition of one of a plurality of operations consisting of the sliding operation in the first direction, the sliding operation in the second direction, the short pressing operation and the long pressing operation, which have been performed with respect to the single electrode (first or second electrode 421, 422) connected to the detecting IC 423, rather to a plurality of electrodes provided in the prior art.

Further, the first and second electrodes 421, 422 are easy to operate, since these electrodes are respectively disposed on the first-electrode surface 6 and second-electrode surface 7, which are provided at the respective two corner portions of the main body housing of the MFP 1. In particular, the sliding operations can be easily performed with respect to the first and second electrodes 421, 422, owing to the first-electrode and second-electrode surfaces 6, 7 which are formed as surfaces different from the upper surface, side surfaces and front surface of the main body housing.

Referring back to the block diagram of FIG. 2, a display control portion 46 is connected to the CPU 21 of the ASIC 26, and to the LCD 41, to control an image displaying operation of the LCD 41.

To the ASIC 26, there are also connected the above-described printer 2, scanner 3 and slot portion 5, and to a panel gate array (panel GA) 27, an amplifier 73, and an NCU 31. A speaker 74 is connected to the amplifier 73, and a MODEM 32 is connected to the NCU 31. Further, a ROM 22, a RAM 23 and an EEPROM 24 are connected to the ASIC 26 through an external bus 25.

The ROM 22 stores control programs for controlling the various operations of the MFP 1, and the RAM 23 has a state memory 23a, a child-lock setting flag 23b, a reception-sound-volume adjusting-direction memory 23c, an image-scrolling-direction memory 23d and an image-rotating-direction memory 23e.

The state memory 23a stores data indicative of the present state of the MFP 1, for example, a sleeping state, a menu-view displaying state, a telephone-function-setting-view displaying state, or an image displaying state. The data stored in the state memory 23a are updated each time the present state of the MFP 1 changes.

The child-lock setting flag 23b indicates whether the MFP 1 is placed in a child-lock state or not. When the MFP 1 is placed in the child-lock state, the child-lock setting flag 23b is placed in an ON state. When the MFP 1 is not placed in the child-lock state, the child-lock setting flag 23b is placed in an OFF state. The child-lock setting flag 23b is set to the ON or OFF state according to a child-lock setting/resetting control routine illustrated in the flow chart of FIG. 6A. In the ON state of the child-lock setting flag 23b, the operation keys 40 and button images displayed on the LCD 41 are held invalid, so that operations or functions corresponding to the operation keys 40 and the button images are not performed even if the operation keys 40 and button images are operated.

The reception-sound-volume adjusting-direction memory 23c stores data indicative of a direction of adjustment of a reception sound volume of the telephone. The reception sound volume is adjustable when the MFP 1 is placed in the telephone-function-setting-view displaying state indicated above (when a telephone function setting view is displayed on the LCD 41). For example, the direction of adjustment of the reception sound volume is set to an incrementing (increasing) direction when the sliding operation in the first direction is performed with respect to the electrostatic sensor 42, and to a decrementing (reducing) direction when the sliding operation in the second direction is performed. Each time the pressing operation is performed with respect to the electrostatic sensor 42, the reception sound volume of the telephone is incremented or decremented by a predetermined amount according to the data stored in the reception-sound-volume adjusting-direction memory 23c.

The image-scrolling-direction memory 23d stores data indicative of a direction (upward or downward direction) of scrolling of the image displayed on the 4 LCD 41 according to an image file stored in the media card, image data read by the scanner 3, or image data received through facsimile transmission. For instance, the direction of scrolling of the image is set to the upward direction when the sliding operation in the first direction is performed with respect to the electrostatic sensor 42, and to the downward direction when the sliding operation in the second direction is performed. Each time the pressing operation is performed with respect to the electrostatic sensor 42, the image displayed on the LCD 41 is scrolled in the upward or downward direction by a predetermined distance according to the data stored in the image-scrolling-direction memory 23d.

The image-rotating-direction memory 23e stores data indicative of a direction of rotation of the image displayed on the LCD 41 according to the image file stored in the media card, image data read by the scanner 3 or image data received through the facsimile transmission.

For example, the direction of rotation of the image is set to a counterclockwise direction when the sliding operation in the first direction is performed with respect to the first electrode 421 while the sliding operation in the second direction is performed with respect to the second electrode 422, and to a clockwise direction when the sliding operation in the second direction is performed with respect to the first electrode 421 while the sliding operation in the first direction is performed with respect to the second electrode 422.

Figure 4:
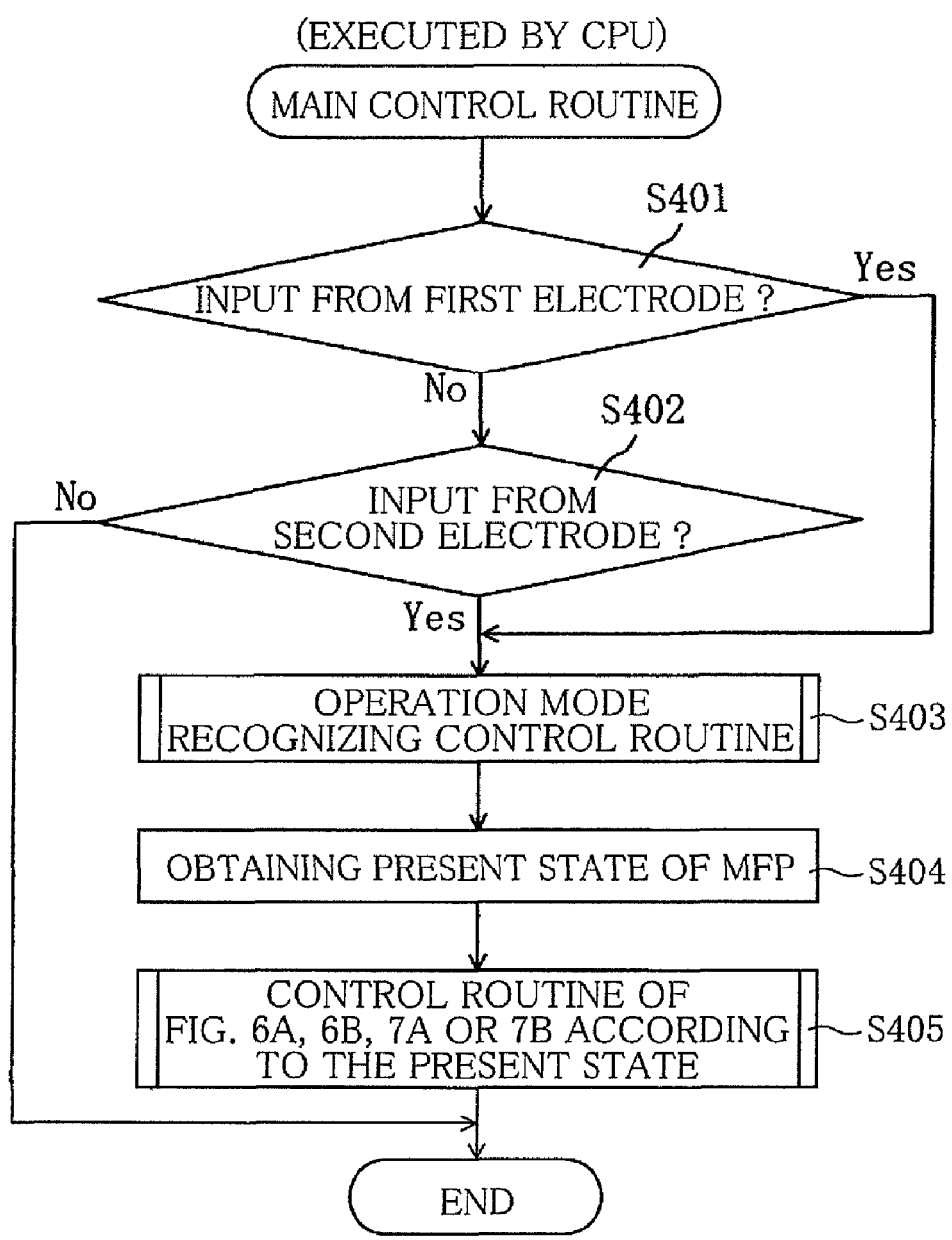
FIG. 4 is a flow chart illustrating a main control routine executed by the control portion.

The flow chart of FIG. 4 illustrates a main control routine executed by the CPU 21. This main control routine is initiated with step S401 to determine whether an output signal has been generated from the first electrode 421. If an affirmative determination (YES) is obtained in the step S401, the control flow goes to step S403 in which the operation mode recognizing control routine illustrated in the flow chart of FIG. 5 is executed to recognize one of the sliding operation in the first direction, sliding operation in the second direction, short pressing operation and long pressing operation, which has been performed with respect to the first electrode 421.

If a negative determination (NO) is obtained in the step S401, the control flow goes to step S402 to determine whether an output signal has been generated from the second electrode 422. If an affirmative determination (YES) is obtained in the step S402, the control flow goes to the step S403 to recognize the operation performed with respect to the second electrode 422. If a negative determination (NO) is obtained in the step S402, one cycle execution of the main control routine is terminated.

The step S403 to recognize the operation performed with respect to the first or second electrode 421, 422 is followed by step S404 to obtain the present state of the MFP 1 on the basis of the data stored in the state memory 23a. Then, the control flow goes to step S405 to perform the above-indicated child-lock setting/resetting control routine of FIG. 6A, a reception-sound-volume adjusting control routine of FIG. 6B, an image scrolling control routine of FIG. 7A, or an image rotation control routine of FIG. 7B, according to the present state obtained in the step S404.

The operation mode recognizing control routine illustrated in the flow chart of FIG. 5 is executed by the CPU 21 in the step S403 to recognize one of the sliding operation in the first direction, sliding operation in the second direction, short pressing operation and long pressing operation, which has been performed with respect to the first electrode 421.

The operation mode recognizing control routine of FIG. 5 is initiated with step S501 to determine whether the output value of the output signal of the detecting IC 423 has reached a judgment start level indicated in FIG. 3B. If a negative judgment (NO) is obtained in the step S501, the control flow goes back to the step S501. The step S501 is repeatedly implemented until an affirmative determination (YES) is obtained therein. If the affirmative determination is obtained in the step S501, the control flow goes to step S502 to determine whether the output value has reached a threshold level also indicated in FIG. 3B. If a negative determination (NO) is obtained in the step S502, the control flow goes back to the step S501. The steps S501 and S502 are repeatedly implemented until an affirmative determination (YES) is obtained in the step S502.

When the affirmative determination (YES) is obtained in the step S502, the control flow goes to step S503 to determine whether the output value of the output signal of the detecting IC 423 is held at a value not larger than the threshold level, during a predetermined time period S1. A negative determination (NO) obtained in the step S503 indicates that the output value which has once become smaller than the threshold level increases beyond the threshold level within the time period S1, as indicated by the broken II in FIG. 3B. If the negative determination is obtained in the step S503, the control flow goes to step S504 in which the CPU 21 determines that the short pressing operation has been performed with respect to the first electrode 421 or second electrode 422.

That is, after the output level of the output signal of the detecting IC 423 has decreased below the judgment start level and threshold level indicated in FIG. 3B, the determination is made as to whether the output level is held at the threshold level or smaller during the time period S1, which is a period from a point of time T1 at which the output value became smaller than the threshold value, to a point of time T2 indicated in FIG. 3B. If the negative determination (NO) is obtained in the step S503, as an abrupt increase of the output value as indicated by the broken line II in FIG. 3B, the CPU 21 recognizes the short pressing operation performed with respect to the first or second electrode 421, 422.

If an affirmative determination (YES) is obtained in the step S503, the control flow goes to step S506 to determine whether the output level is held at the value not larger than the threshold level during a predetermined time period S2 which is longer than the time period S1 and which ends at a point of time T3, as indicated in FIG. 3B. An affirmative determination (YES) obtained in the step S506 indicates that the output value is held at the threshold value or smaller during the time period S2, as indicated by the broken line III. If the affirmative determination is obtained in the step S506, the control flow goes to step S507 in which the CPU 21 determines that the long pressing operation has been performed with respect to the first or second electrode 421, 422.

That is, after the output level of the output signal of the detecting IC 423 is held at the threshold level or smaller during the time period S1, the determination is made as to whether the output level is further held at the threshold level or smaller during the time period S2, as indicated by the broken line III in FIG. 3B. If the affirmative determination (YES) is obtained in the step S506, the CPU 21 recognizes the long pressing operation performed with respect to the first or second electrode 421, 422.

If a negative determination (NO) is obtained in the step S506, the control flow goes to step S508 to determine whether the output value of the output signal of the detecting IC 423 continuously substantially linearly increases during a predetermined time period S3. If an affirmative determination (YES) is obtained in the step S508, the control flow goes to step S509 in which the CPU 21 determines that the sliding operation in the first direction has been performed with respect to the first or second electrode 421, 422.

That is, if the output value of the output signal of the detecting IC 423 is held at the threshold value or smaller during the time period S1, but is not held at the threshold value or smaller during the time period S2, the determination is made as to whether the output value substantially linearly increases to a value larger than the threshold value, during the time period S2 between the point of time T2 and the point of time T3, as indicated by the solid line I in FIG. 3B. If the affirmative determination (YES) is obtained in the step S508, the CPU 21 recognizes the sliding operation in the first direction has been performed with respect to the first or second electrode 421, 422.

If a negative determination (NO) is obtained in the step S508, the control flow goes to step S510 to determine whether the output value of the output signal of the detecting IC 423 continuously substantially linearly decreases during the time period S3. If an affirmative determination (YES) is obtained in the step S510, the control flow goes to step S511 in which the CPU 21 determines that the sliding operation in the second direction has been performed with respect to the first or second electrode 421, 422.

If a negative determination (NO) is obtained in the step S510, the control flow goes to step S512 in which the CPU 21 determines that an input error has taken place, and to step S513 in which the LCD 41 provides an indication prompting the operator to perform a re-input operation with respect to the first or second electrode 421, 422. In this case, one cycle of execution of the present control routine is terminated with step S513.

As described above, the short pressing operation is recognized in the step S504, and the long pressing operation is recognized in the step S507. Further, the sliding operation in the first direction is recognized in the step S509, and the sliding operation in the second direction is recognized in the step S511. The steps S504, S507, S509 and S511 are followed by step S505 to determine whether the output value has exceeded a predetermined judgment end level. If a negative determination (NO) is obtained in the step S505, this step is repeatedly implemented until an affirmative determination (YES) is obtained in the step. One cycle of execution of the present control routine is terminated with the step S505. It will be understood that the step S502 corresponds to a first judging portion configured to determine whether the output value of the output signal of the detecting IC 423 has reached a predetermined threshold value, and the step S503 corresponds to a second judging portion configured to determine whether the output value is held at a value not larger than the threshold value during a first time period, while the steps S508 and S510 correspond to a third judging portion configured to determine whether a change of the output value corresponding to the sliding operation has taken place after the second judging portion has determined that the output value is held at the value not larger than the threshold value during the first time period. It will also be understood that the step S506 corresponds to a fourth judging portion configured to determine, after the second judging portion determines that the output value is held at the value not larger than the threshold value during the first time period, whether the output value is held at the value not larger than the threshold value during a second time period longer than the first time period, while the step S510 corresponds to a fifth judging portion configured to determine, after the fourth judging portion determines that the output value is not held at the value not larger than the threshold value during the second time period, whether the change of the output value corresponding to the sliding operation has taken place. It will further be understood that the steps S504, S507, S509 and S511 correspond to an operation recognizing portion configured to recognize one of the short pressing operation, the long pressing operation, the sliding operation in the first direction, and the sliding operation in the second direction, on the basis of the change of the output value of the output signal of the detecting IC 423.

Thus, the present MFP 1 permits easy recognition of the specific operation performed with respect to the first electrode 421 or second electrode 422, that is, one of the short and long pressing operations and the sliding operations in the first and second directions.

Figure 6A:
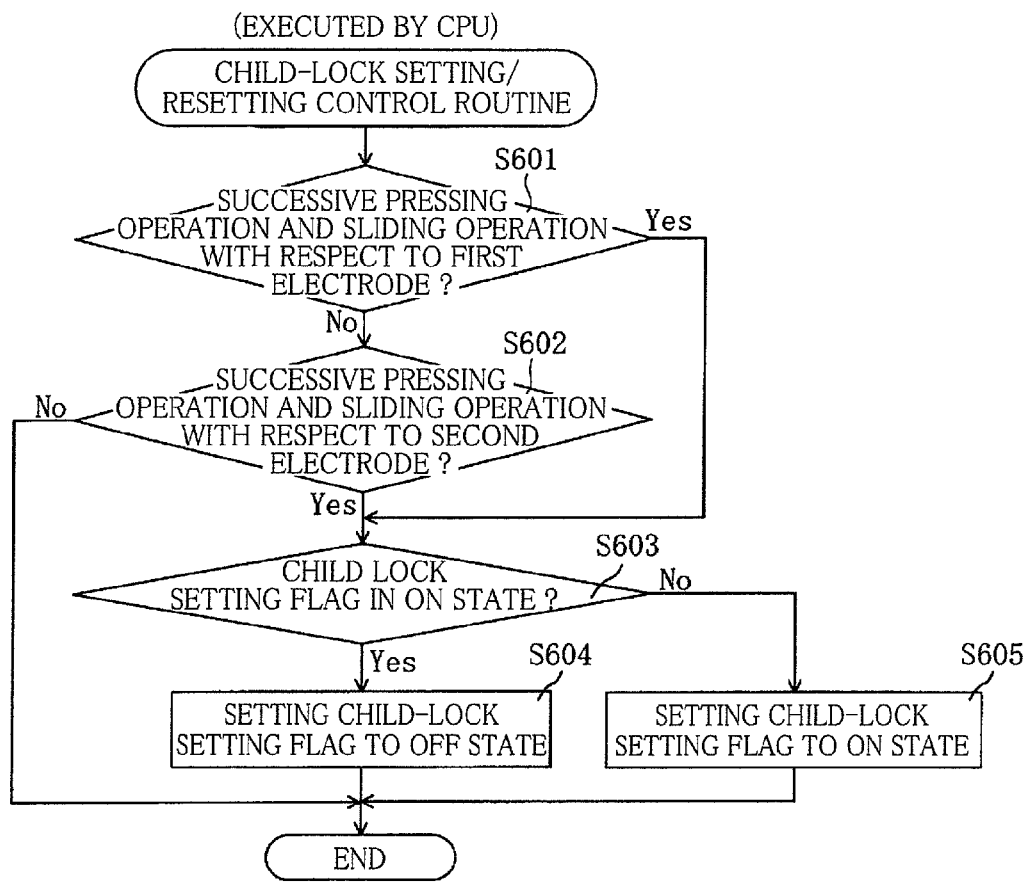
FIG. 6A is a flow chart illustrating a child-lock setting/resetting control routine executed by the control portion.

The flow chart of FIG. 6A illustrates the child-lock setting/resetting control routine, which is formulated to set or reset a child-lock setting function. This child-lock setting/resetting control routine is executed by the CPU 21 when the MFP 1 is placed in the sleeping state or in the menu-view displaying state.

The child-lock setting/resetting control routine is initiated with step S601 to determine whether the pressing operation (short or long pressing operation) and the sliding operation (in the first or second direction) have been successively performed with respect to the first electrode 421. If a negative determination (NO) is obtained in the step S601, the control flow goes to step S602 to determine whether the pressing operation and the sliding operation have been successively performed with respect to the second electrode 422. If a negative determination (NO) is obtained in the step S602, one cycle of execution of the present control routine is terminated.

If an affirmative determination (YES) is obtained in the step S601 or S602, that is, if the pressing operation and the sliding operation have been successively performed with respect to the first electrode 421 or the second electrode 422, the control flow goes to step S603 to determine whether the child-lock setting flag 23b is placed in the ON state. If an affirmative determination (YES) is obtained in the step S603, the control flow goes to step S604 to set the child-lock setting flag 23b to the OFF state, that is, to reset the child lock setting function, and one cycle of execution of the present control routine is terminated. If a negative determination (NO) is obtained in the step S603, the control flow goes to step S605 to set the child-lock setting flag 23b to the ON state, that is, to set the child lock setting function, and one cycle execution of the control routine is terminated.

Thus, the child-lock setting/resetting control routine makes it possible to set or reset the child lock setting function when the pressing operation and the sliding operation have been successively performed with respect to the first or second electrode 421, 422. The child lock setting function is a function to inhibit a predetermined function when a predetermined operation is performed. In this respect, it is noted that adults know a rule that the successive pressing and sliding operations with the first or second electrode 421, 422 result in an automatic change of the state of the child-lock setting flag 23b from the ON state to the OFF state or vice versa, while children, animal pets or the like do not recognize this fact. The child lock setting function can be easily set or reset by the simple operations with respect to the single electrode 421, 422, but are unlikely to be unfavorably set or reset by the children or animal pets. It will be understood that the steps S601 and S602 correspond to an operation detecting portion configured to determine whether the pressing operation and the sliding operation of the finger F have been successively performed with respect to the electrode 421, 422, while the steps S604 and S605 correspond to a setting portion configured to inhibit or permit the selected functions of the MFP 1.

Figure 6B:
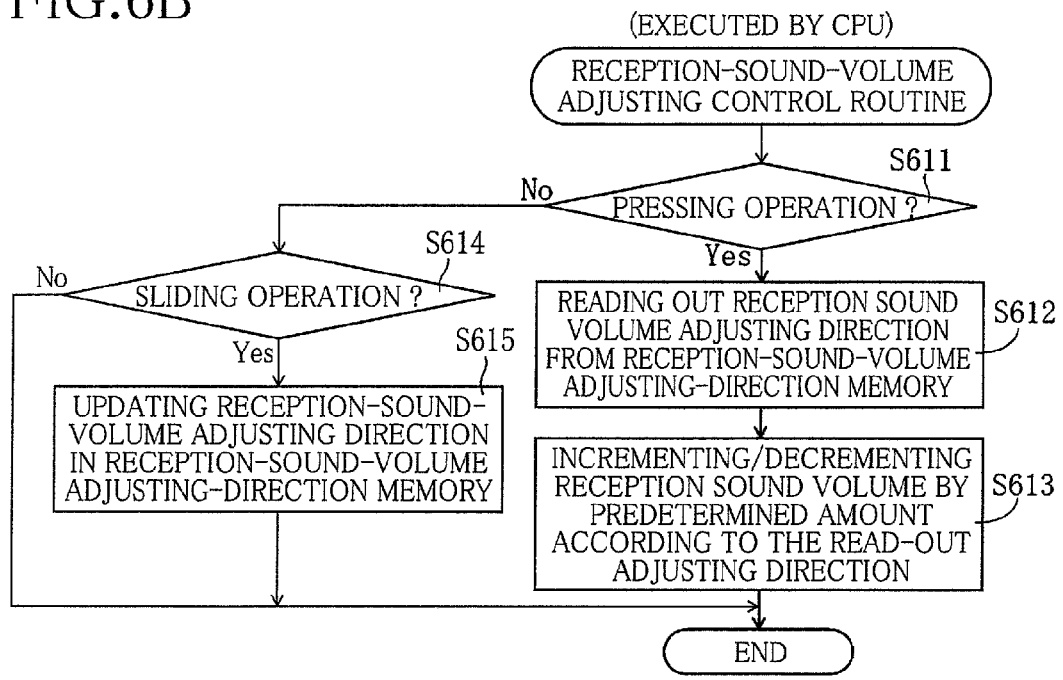
FIG. 6B is a flow chart illustrating a reception-sound-volume adjusting control routine executed by the control routine.

The flow chart of FIG. 6B illustrates the reception-sound-volume adjusting control routine, which is executed by the CPU 21 to increase or decrease the reception sound volume of the telephone when the MFP 1 is placed in the telephone-function-setting-view displaying state in which a telephone function setting view is displayed on the LCD 41. The present reception-sound-volume adjusting control routine is initiated with step S611 to determine whether the short or long pressing operation has been performed with respect to the first or second electrode 421, 422. If an affirmative determination (YES) is obtained in the step S611, the control flow goes to step S612 to read out the direction of adjustment data from the reception-sound-volume adjusting-direction memory 23c, and to step S613 to increment or decrement the reception sound volume of the telephone by the predetermined amount, according to the read-out direction of adjustment data. In this case, one cycle of execution of the control routine is terminated with the step S613.

If a negative determination (NO) is obtained in the step S611, the control flow goes to step S614 to determine whether the sliding operation (in the firs or second direction) has been performed with respect to the first or second electrode 421, 422. If a negative determination (NO) is obtained in the step S614, one cycle of execution of the present control routine is terminated with the step S614. If an affirmative determination (YES) is obtained in the step S614, the control flow goes to step S615 to update the direction of adjustment data stored in the reception-sound-volume adjusting-direction memory 23c. For example, the direction of adjustment is set to the incrementing direction when the sliding operation has been performed in the first direction, and to the decrementing direction when the sliding operation has been performed in the second direction. In this case, one cycle of execution of the present control routine is terminated with the step S615.

Thus, the reception-sound-volume adjusting control routine makes it possible to update the direction of adjustment data stored in the reception-sound-volume adjusting-direction memory 23c when the sliding operation in the first or second direction has been performed with respect to the first or second electrode 421, 422, and to increment or decrement the reception sound volume of the telephone according to the direction of adjustment data stored in the reception-sound-volume adjusting-direction memory 23c, each time the pressing operation has been performed with respect to the first or second electrode 421, 422. The reception sound volume of the telephone can be easily adjusted by the simple operation with respect to the single electrode 421, 422. It will be understood that the step S613 corresponds to a sound-volume setting portion configured to control the sound-volume adjusting portion such that each time the pressing operation of the finger F is recognized by the operation recognizing portion, the volume of the sound generated by the speaker 74 is incremented or decremented by the predetermined amount, depending upon the direction of the sliding operation represented by the data stored in the reception-sound-volume adjusting-direction memory 23c.

Figure 7A:
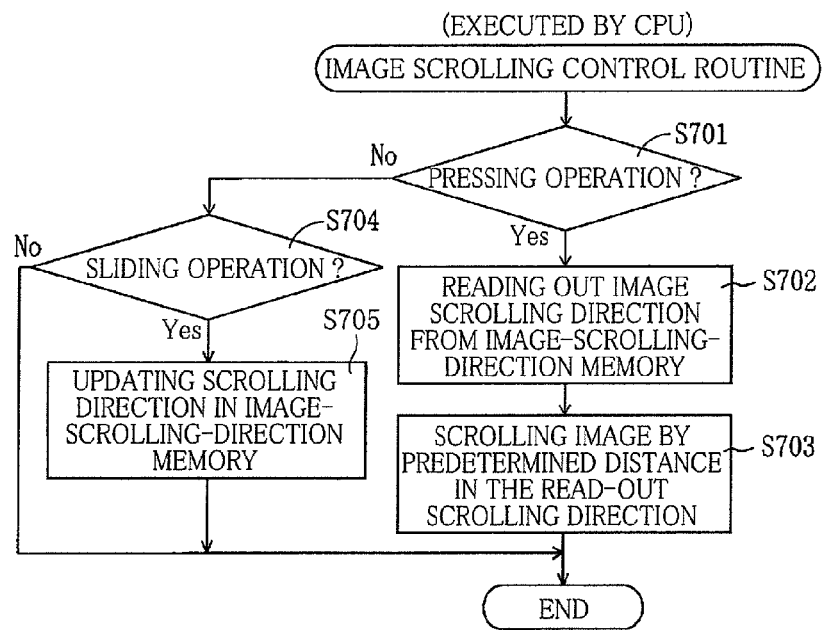
FIG. 7A is a flow chart illustrating an image scrolling control routine executed by the control portion.

The flow chart of FIG. 7A illustrates the image scrolling control routine, which is executed by the CPU 21 to scroll the image displayed on the LCD 41, in the upward or downward direction, when the MFP 1 is placed in a state in which the LCD 41 displays the image according to an image file stored in the media card, image data read by the scanner 3, or image data received through facsimile transmission.

The image scrolling control routine is initiated with step S701 to determine whether the short or long pressing operation has been performed with respect to the first or second electrode 421, 422. If an affirmative determination (YES) is obtained in the step S701, the control flow goes to step S702 to read out the image-scrolling-direction data from the image-scrolling-direction memory 24d, and to step S703 to scroll the image displayed on the LCD 41, by the predetermined distance in the upward or downward direction according to the read-out image-scrolling-direction data. In this case, one cycle of execution of the present routine is terminated with the step S703.

If a negative determination (NO) is obtained in the step S701, the control flow goes to step S704 to determine whether the sliding operation (in the first or second direction) has been performed with respect to the first or second electrode 421, 422. If a negative determination (NO) is obtained in the step S704, one cycle of execution of the present control routine is terminated with the step S704. If an affirmative determination (YES) is obtained in the step S704, the control flow goes to step S705 to update the image-scrolling-direction data stored in the image-scrolling-direction memory 23d. For example, the image scrolling direction is set to the upward direction when the sliding operation has been performed in the first direction, and to the downward direction when the sliding operation has been performed in the second direction. In this case, one cycle of execution of the present control routine is terminated with the step S705.

Thus, the image scrolling control routine makes it possible to update the image-scrolling-direction data stored in the image-scrolling-direction memory 23d when the sliding operation in the first or second direction has been performed with respect to the first or second electrode 421, 422, and to scroll the image displayed on the LCD 41, by the predetermined distance in the upward or downward direction according to the image-scrolling-direction data stored in the image-scrolling-direction memory 23d, each time the pressing operation has been performed with respect to the first or second electrode 421, 422. The image displayed on the LCD 41 can be easily scrolled by the simple operation with respect to the single electrode 421, 422.

Figure 7B:
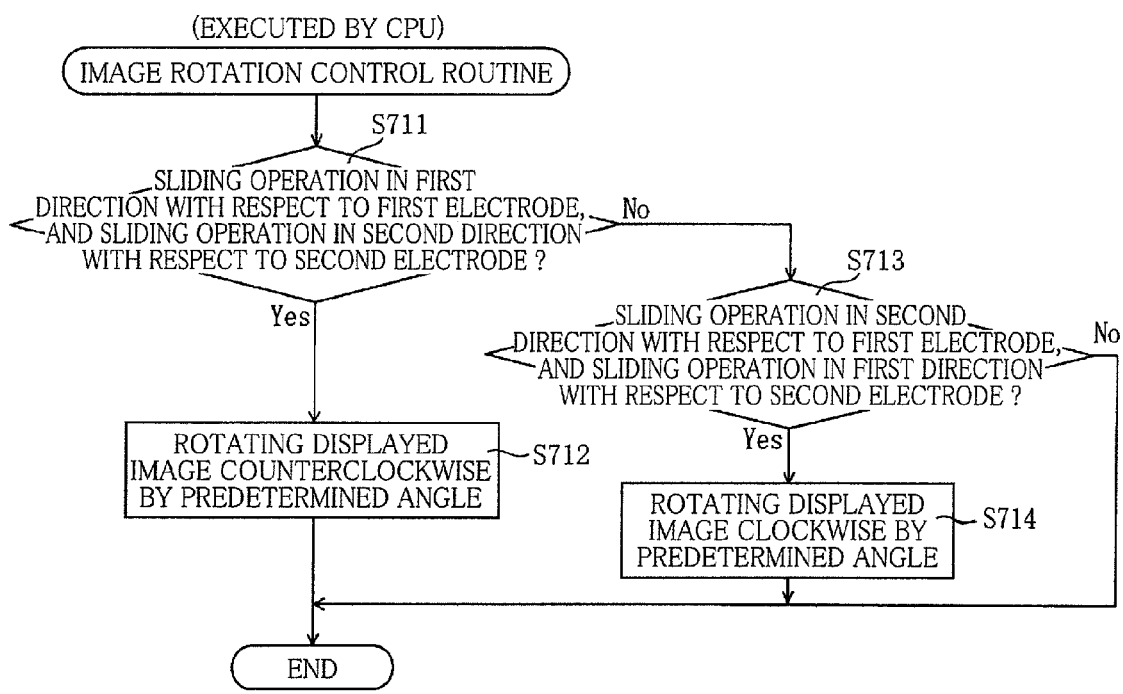
FIG. 7B is a flow chart illustrating an image rotation control routine executed by the control portion.

The flow chart of FIG. 7B illustrates the image rotation control routine, which is executed by the CPU 21 to rotate the image displayed on the LCD 41, when the MFP 1 is placed in the state in which the LCD 41 displays the image according to the image file stored in the media card, the image data read by the scanner 3, or the image data received through the facsimile transmission.

The image rotation control routine is initiated with step S711 to determine whether the sliding operation has been performed in the first direction with respect to the first electrode 421 while the sliding operation has been performed in the second direction with respect to the second electrode 422. If an affirmative determination (YES) is obtained in the step S711, the control flow goes to step S712 to rotate the image displayed on the LCD 41, by a predetermined angle in the counterclockwise direction. In this case, one cycle of execution of the present image rotation control routine is terminated with the step S712.

Figure 8A:
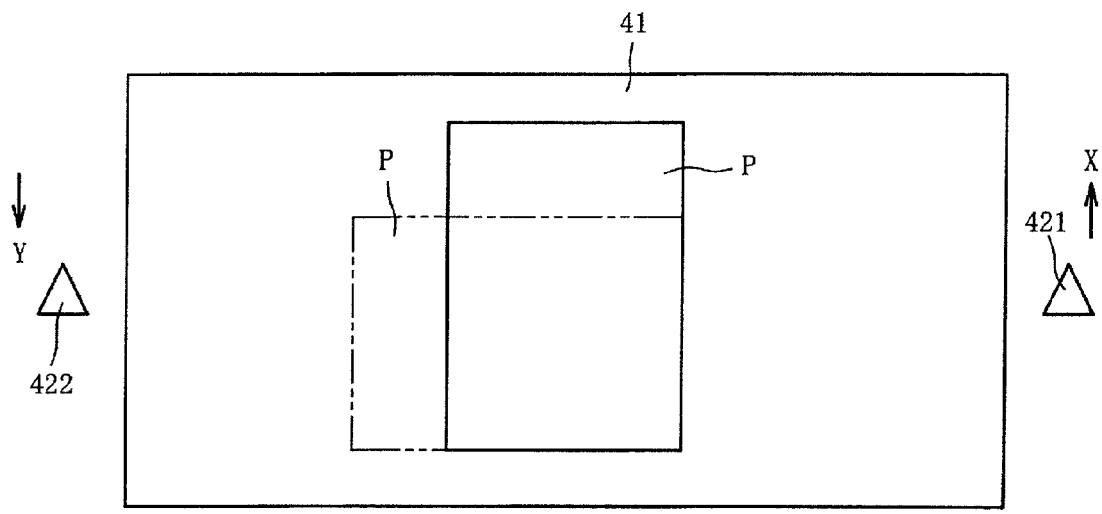
FIG. 8A is a view indicating 90° counterclockwise rotation of an image displayed on an LCD.

Referring to FIG. 8A, there is shown an example in which the sliding operation in the first direction indicated by an arrow-headed line X is performed with respect to the first electrode 421, and the sliding operation in the second direction indicated by an arrow-headed line Y is performed with respect to the second electrode 422, while an image P is displayed on the LCD 41 as indicated by solid line. In this case, the displayed image P is rotated counterclockwise by 90 degrees as indicated by two-dot chain line in FIG. 8A.

If a negative determination (NO) is obtained in the step S711, the control flow goes to step S713 to determine whether the sliding operation has been performed in the second direction with respect to the first electrode 421, while the sliding operation has been performed in the first direction with respect to the second direction 422. If a negative determination (NO) is obtained in the step S713, one cycle of execution of the present control routine is terminated with the step S713. If an affirmative determination (YES) is obtained in the step S713, the control flow goes to step S714 to rotate the image displayed on the LCD 41, by the predetermined angle in the clockwise direction. In this case, one cycle of execution of the present control routine is terminated with the step S714.

Figure 8B:
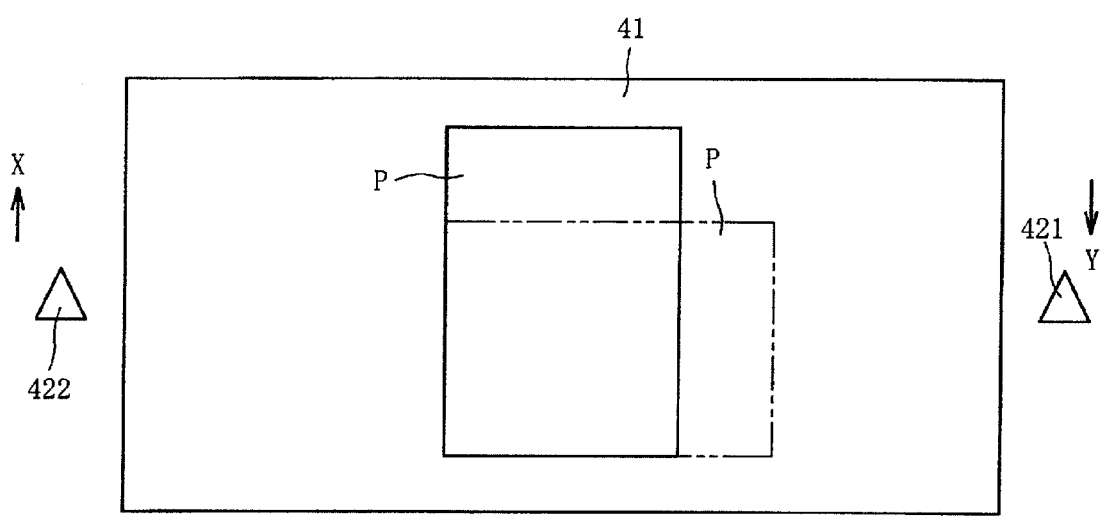
FIG. 8B is a view indicating 900 clockwise rotation of the image displayed on the LCD.

Referring to FIG. 8B, there is shown an example in which the sliding operation in the second direction indicated by the arrow-headed line Y is performed with respect to the first electrode 421, and the sliding operation in the first direction indicated by the arrow-headed line X is performed with respect to the second electrode 422, while the image P is displayed on the LCD 41 as indicated by the solid line. In this case, the displayed image P is rotated clockwise by 90 degrees as indicated by two-dot chain line in FIG. 8B.

Thus, the image rotation control routine makes it possible to rotate the image displayed on the LCD 41, by the predetermined angle, in the desired counterclockwise or clockwise direction, by performing the sliding operations with respect to the first and second electrodes 421, 422 in the respective opposite first and second directions. The counterclockwise or clockwise direction is selected depending upon the directions of the sliding operations with respect to the respective first and second electrodes 421, 422. In this respect, it is noted that the first and second electrodes 421, 422 are disposed on the respective opposite right and left sides of the image displayed on the LCD 41, and the two combinations of the two directions of the sliding operations with respect to the two electrodes 421, 422 correspond to the counterclockwise and clockwise directions, so that the operator can easily recognize the relationship between the directions of the sliding operations and the direction of rotation of the displayed image. It will be understood that the step S711 corresponds to a first operation detecting portion configured to determine whether the operation recognizing portion has determined that the sliding operation of the finger F in the first direction is performed with respect to one of the first and second electrodes 421, 422, while the sliding operation of the finger F in the second direction is performed with respect to the other of the two electrodes 421, 422, while the step S713 corresponds to a second operation detecting portion configured to determine whether the operation recognizing portion has determined that the sliding operation of the finger F in the second direction is performed with respect to the above-indicated one of the two electrodes 421, 422, while the sliding operation of the finger F in the first direction is performed with the other of the two electrodes 421, 422. It will also be understood that the steps S712, S714 respectively correspond to first and second display control portions configured to rotate counterclockwise and clockwise the image displayed on the LCD 41, by the predetermined angle, when the first and second operation detecting portions determine that the operation recognizing portion has recognized the sliding operations in the first and second directions with respect to the one and other of the first and second electrodes 421, 422, or vice versa.

Figure 9A:
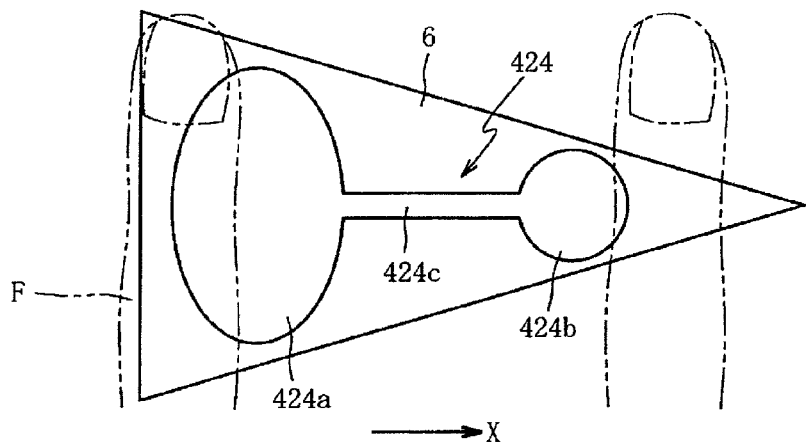
FIG. 9A is a view showing a first electrode disposed on the first-electrode surface in a second embodiment of this invention, and the operator's finger operating the first electrode.
Figure 9B:
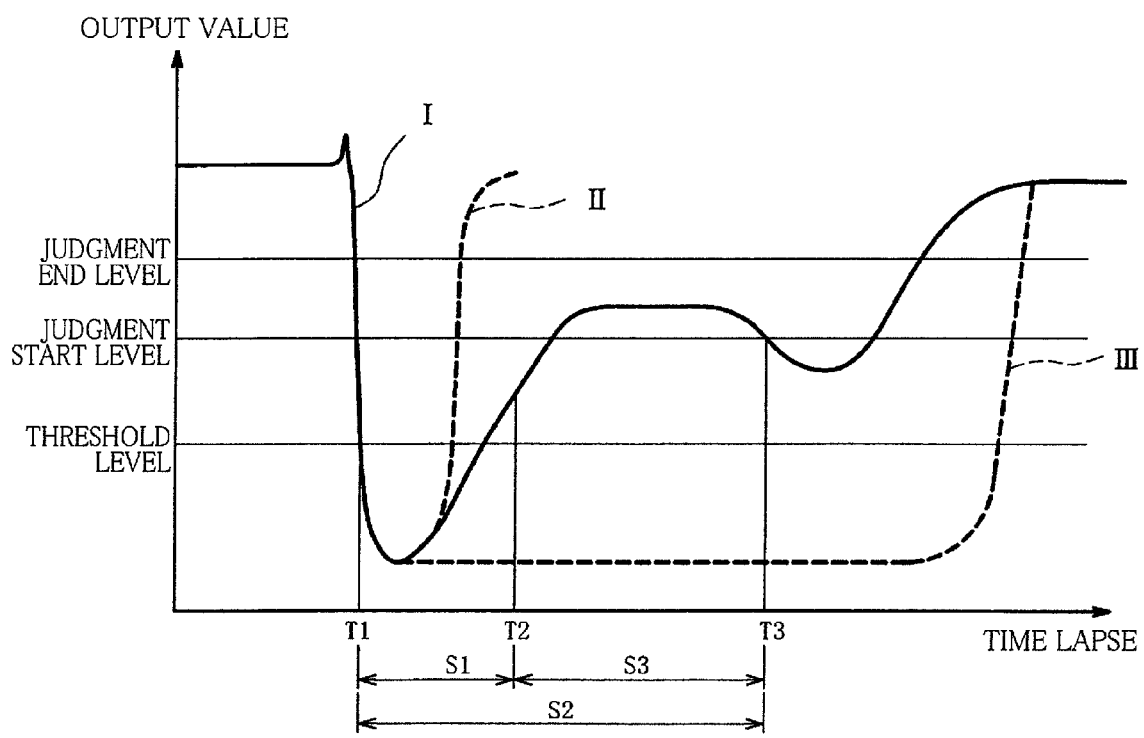
FIG. 9B is a graph indicating a change of an output value of an output signal of the detecting IC, which is generated when the first electrode in the second embodiment is operated.

Referring next to FIGS. 9A and 9B, there will be described a second embodiment of the present invention. In the first embodiment, the first and second electrodes 421, 422 have the substantially isosceles triangle shape. In the second embodiment, however, each of first and second electrodes has two elliptical regions connected to each other by a connecting region, as described below in detail.

FIGS. 9A and 9B respectively correspond to FIGS. 3A and 3B showing the first embodiment. FIG. 9A is a view showing the first electrode 424 disposed on the first-electrode surface 6, and an operator's finger F operating the first electrode 424, while FIG. 9B is a graph indicating a change of an output value of the output signal of the detecting IC 423, which is generated when the first electrode 424 is operated by the finger F.

As shown in FIG. 9A, the first electrode 424 consists of an elliptical first region 424a located on the left side as seen in FIG. 9A, an elliptical second region 424b located on the right side and having a smaller size than the first region 424a, and a connecting region 424c connecting the elliptical first and second regions 424a, 424b to each other. The second electrode in the second embodiment has the same shape as the first electrode.

To begin with, a sliding operation of the operator's finger F with respect to the first electrode 424 in the first direction (indicated by the arrow-headed line X) will be described.

During an initial portion of the sliding operation in the first direction, the output value of the output signal of the detecting IC 423 changes as indicated by a solid line I indicated in FIG. 8B. In the initial portion of the sliding operation in the first direction, the output value decreases to a predetermined value as the right side surface of the finger F is initially moved in the rightward direction from the left edge of the first electrode 424, while the finger F is in close proximity to or in touch with the elliptical first region 424a. As the finger F is subsequently further moved in the rightward direction indicated by the arrow-headed line X in FIG. 9A, the output value gradually and substantially linearly increases. While the finger F is moved on or over the connecting region 424c, the output value is held substantially constant. The output value slightly decreases while the finger F is moved on or over the elliptical second region 424b. When the finger F has passed the second region 424b, the output value returns back to the initial value.

When the sliding operation in the second direction (leftward direction) opposite to the first direction (rightward direction) is performed with respect to the first electrode 424, the output value of the output signal of the detecting IC 423 changes in a pattern reversed with respect to that in the case of the sliding operation in the first direction. When the short pressing operation is performed with respect to the first electrode 424, the output value changes as indicated by the broken line II, as in the first embodiment. When the long pressing operation is performed with respect to the first electrode 424, the output value changes as indicated by broken line III, as in the first embodiment.

In the present embodiment, too, an operation mode recognizing control routine similar to that illustrated in the flow chart of FIG. 5 is executed by the CPU 21 to recognize one of the sliding operation in the first direction, sliding operation in the second direction, short pressing operation and long pressing operation, with respect to the first electrode 424 or second electrode, by comparing the pattern of actual change of the output value of the output signal of the detecting IC 423, with the pattern indicated by the solid line I of FIG. 9B, the pattern reversed with the pattern indicated by the solid line I, and the patterns indicated by the broken lines II and III of FIG. 9B.

The operation mode recognizing control routine executed in the present second embodiment is different from that of FIG. 5 in the first embodiment, in respect of the steps S508 and S509. In the second embodiment, the step S508 is formulated to determine whether the output value of the detecting IC 423 during the time period S3 continuously linearly increases and is subsequently held substantially constant. If an affirmative determination is obtained in the step S508, the control flow goes to the step S509 to recognize the sliding operation in the first direction. If a negative determination is obtained in the step S508, the control flow goes to the step S510 to determine whether the output value of the detecting IC 423 during the time period S3 continuously linearly decreases and is subsequently held substantially constant. If an affirmative determination is obtained in the step S509, the control flow goes to the step S511 to recognize the sliding operation in the second direction.

Although the preferred embodiments of this invention have been described by reference to the accompanying drawings, it is to be understood that the present invention is not limited to the details of the illustrated embodiments, but may be embodied with various changes and improvements, which may occur to those skilled in the art, without departing from the spirit and scope of the present invention.

While the first and second electrodes 421, 422 in the first embodiment have the substantially isosceles triangle shape and the first electrode 424 and the second electrode in the second embodiment have the elliptical regions, the shape of the electrode provided according to the principle of this invention is not limited to those of the electrodes 421, 422, 424, provided a dimension of the electrode as seen in a direction perpendicular to a direction of extension of the electrode changes (increases or decreases) in the direction of extension. For example, the electrode has a shape of a right-angled triangle, a trapezoidal shape, a sector shape, or an L-shape. Further, the dimension of the electrode as seen in a direction intersecting the direction of extension of the electrode may change (increase or decrease) in the direction of extension. For instance, the electrode may have a shape of a triangle having an obtuse angle.

The main body housing of the MFP 1 according to the illustrated embodiment has the two corner portions that are formed to provide the first-electrode surface 6 and second-electrode surface 7 in the form of the substantially isosceles triangle. However, the positions at which the first-electrode and second-electrode surfaces 6, 7 are provided are not limited to the corner portions of the main body housing. For instance, the first-electrode and second-electrode surfaces may be provided on the operation panel 4 such that the LCD 41 is interposed between the first-electrode and second-electrode surfaces. Further, the first-electrode and second-electrode surfaces may have a shape or shapes other than the substantially isosceles triangle shape, and preferably have a size or sizes slightly larger than that or those of the first and second electrodes.

The image rotation control routine illustrated in the flow chart of FIG. 7B is formulated such that the image displayed on the LCD 41 is automatically rotated by the predetermined angle in the counterclockwise or clockwise direction selected by the combination of the directions of the two sliding operations performed with respect to the first and second electrodes 421, 422. However, the image rotation control routine may be modified such that the direction of rotation of the displayed image which direction is determined by the directions of the sliding operations performed with respect to the two electrodes 421, 422 is stored in a memory, and the displayed image is rotated by a predetermined angle in the direction stored in the memory, each time the pressing operation is performed with respect to the first or second electrode 421, 422.

In the illustrated embodiments, the MFP 1 is provided with the input device constructed according to the present invention. However, the input device of the present invention may be provided in a copying apparatus, a facsimile apparatus, a telephone set apparatus, a digital camera apparatus, etc., provided the input device is provided with elements corresponding to the electrostatic sensor 42 and the CPU 21.

In the illustrated embodiments, the electrostatic sensor 42 is formed such that the output value of the output signal of the detecting IC 423 decreases with an increase of the surface area of the first electrode 421, 424 which is covered by the finger F. However, the electrostatic sensor 42 may be formed such that the output value of the detecting IC 423 increases with the increase of the surface area of the first electrode 421, 424 covered by the finger F.

While the manner of recognition of the pressing or sliding operation with respect to the first electrode 424 having the two elliptical regions 424a, 424b has been described above by reference to the graph of FIG. 9B, the manner of recognition may be modified to recognize the sliding operation in the first direction if the output value of the detecting IC 423 first exceeds a judgment level corresponding to the first region 424a and then reaches a judgment level corresponding to the connecting region 424c, and to recognize the sliding operation in the second direction if the output value first exceeds a judgment level corresponding to the second region 424b and then reaches the judgment level corresponding to the connecting region 424c.

What is claimed is:

1. An input device comprising:
    an electrode extending in a predetermined direction and having a width dimension as seen in a direction intersecting the predetermined direction of extension, the width dimension changing in the predetermined direction of extension;
    an output portion configured to generate an output signal an output value of which corresponds to an electrostatic capacity induced between the electrode and an electrically charged body when the electrically charged body approaches or touches the electrode;
    a detecting portion configured to detect a change of the output value of the output signal of the output portion; and
    an operation recognizing portion configured to recognize, on the basis of the change of the output value detected by the detecting portion, one of a short pressing operation and a sliding operation of the electrically charged body performed with respect to the electrode, the short pressing operation being performed by an action of the electrically charged body in which the electrically charged body approaches or touches the electrode, while the sliding operation being performed by a sliding action of the electrically charged body in the predetermined direction of extension of the electrode while the electrically charged body is held in close proximity to or in touch with the electrode.

2. The input device according to claim 1, wherein the detecting portion includes a first judging portion configured to determine whether the output value has reached a predetermined threshold value, a second judging portion configured to determine whether the output value is held at a value equal to or smaller than, or equal to or larger than the predetermined threshold value during a first time period after a moment at which the output value has reached the threshold value, and a third judging portion configured to determine whether a change of the output value corresponding to the sliding operation has taken place after the second judging portion has determined that the output value is held at the value equal to or smaller than, or equal to or larger than the threshold value during the first time period,
    and wherein the operation recognizing portion recognizes the sliding operation when the third judging portion determines that the change of the output value corresponding to the sliding operation has taken place.

3. The input device according to claim 2, wherein the third judging portion determines that the change of the output value corresponding to the sliding operation has taken place, if the output value changes according to a change of a surface area of the electrode which is touched by or opposed to the electrically charged body during the sliding action.

4. The input device according to claim 2, wherein the operation recognizing portion recognizes the short pressing operation when the second judging portion determines that the output value is not held at the value equal to or smaller than, or equal to or larger than the predetermined threshold value during the first time period.

5. The input device according to claim 4, wherein the detecting portion further includes a fourth judging portion configured to determine, after the second judging portion determines that the output value is held at the value equal to or smaller than, or equal to or larger than the predetermined threshold value during the first time period, whether the output value is held at the value equal to or smaller than, or equal to or larger than the predetermined threshold value during a second time period longer than the first time period,
    and wherein the operation recognizing portion recognizes a long pressing operation of the electrically charged body in which the electrically charged body approaches or touches the electrode for a time period longer than a time period of the action of the short pressing operation, when the fourth judging portion determines that the output value is held at the value equal to or smaller than, or equal to or larger than the threshold value during the second time period.

6. The input device according to claim 5, wherein the detecting portion further includes a fifth judging portion configured to determine, after the fourth judging portion determines that the output value is not held at the value equal to or smaller than, or equal to or larger than the predetermined threshold value during the second time period, whether said change of the output value corresponding to the sliding operation has taken place,
    and wherein the operation recognizing portion recognizes the sliding operation when the fifth detecting portion determines that said change of the output value corresponding to the sliding operation has taken place.

7. The input device according to claim 1, wherein the third judging portion is configured to detect one of a first change of the output value corresponding to the sliding operation in a first direction parallel to the predetermined direction of extension of the electrode, and a second change of the output value corresponding to the sliding operation in a second direction parallel to the predetermined direction of extension of the electrode and opposite to the first direction,
    and wherein the operation recognizing portion recognizes the sliding operation in the first direction when the third judging portion detects the first change of the output value, and the sliding operation in the second direction when the third judging portion detects the second change of the output value.

8. The input device according to claim 7, wherein the electrode is formed such that the width dimension changes along a straight or curved line as the electrode extends in the predetermined direction of extension.

9. A multi-function peripheral provided with an input device as defined in claim 7 and having at least two functions selected from among a telephone function, a facsimile function, a printing function, a copying function and a scanning function, the multi-function peripheral comprising:
    a main body housing of box construction;
    an image display portion configured to display an image, or at least one operation control portion, which image display portion or at least one operation control portion being disposed on one surface of the main body housing; and
    an electrode surface on which the electrode of the input device is disposed,
    and wherein the electrode surface is formed at a corner portion of the main body housing, which corner portion includes a corresponding corner edge of said one surface of the main body housing.

10. The multi-function peripheral according to claim 9, having at least the telephone function and the facsimile function and further comprising:
    a speaker; and a sound-volume adjusting portion configured to adjust a volume of a sound generated by the speaker;

a memory portion which stores data indicative of a direction of the sliding operation of the electrically charged body such that the data are updated each time the operation recognizing portion recognizes the sliding operation; and a sound-volume setting portion configured to control the sound-volume adjusting portion such that each time the short pressing operation of the electrically charged body is recognized by the operation recognizing portion, the volume of the sound generated by the speaker is incremented or decremented by a predetermined amount, depending upon the direction of the sliding operation represented by the data stored in the memory portion.

11. The multi-function peripheral according to claim 9, further comprising:

a memory portion which stores data indicative of a direction of the sliding operation of the electrically charged body such that the data are updated each time the operation recognizing portion recognizes the sliding operation; and a display control portion configured to move the image displayed on the image display portion, in a direction determined by the direction of the sliding operation represented by the data stored in the memory portion, each time the short pressing operation of the electrically charged body is recognized by the operation recognizing portion.

12. The multi-function peripheral according to claim 9, wherein said electrode is disposed at each of two positions between which the image display portion is located, the multi-function peripheral further comprising:

a first operation detecting portion configured to determine whether the operation recognizing portion has determined that the sliding operation of the electrically charged body in the first direction is performed with respect to one of the two electrodes disposed at said two positions, while the sliding operation of the electrically charged body in the second direction is performed with respect to the other of the two electrodes;

a first display control portion configured to rotate counterclockwise the image displayed on the image display portion, by a predetermined angle, when the first operation detecting portion determines that the operation recognizing portion has recognized the sliding operations in the first and second directions respectively performed with respect to said one and the other of the two electrodes;

a second operation detecting portion configured to determine whether the operation recognizing portion has determined that the sliding operation of the electrically charged body in the second direction is performed with respect to said one of the two electrodes, while the sliding operation of the electrically charged body in the first direction is performed with respect to said other of the two electrodes; and a second display control portion configured to rotate clockwise the image displayed on the image display portion, by a predetermined angle, when the second operation detecting portion determines that the operation recognizing portion has recognized the sliding operations in the second and first directions respectively performed with respect to said one and the other of the two electrodes.

13. A multi-function peripheral provided with an input device as defined in claim 1 and having at least two functions selected from among a telephone function, a facsimile function, a printing function, a copying function and a scanning function, the multi-function peripheral comprising:

an operation detecting portion configured to determine whether the short pressing operation and the sliding operation of the electrically charged body have been successively performed with respect to the electrode; and a setting portion configured to inhibit or permit at least one of the at least two functions, when the operation detecting portion determines that the short pressing operation and the sliding operation have been successively performed.

* * * * *